STEP 1

STEP 2

STEP 3

STEP 4

STEP 5

STEP 6

STEP 7

STEP 8

STEP 9

STEP 10

STEP 11

STEP 12

STEP 13

STEP 14

INVENTOR
CARL E. RUOFF
BY John C Black
ATTORNEY

Jan. 26, 1971 C. E. RUOFF 3,557,444

MONOLITHIC BIPOLAR TRANSISTOR LOGIC CIRCUIT
AND METHOD OF FORMING SAME

Filed Oct. 11, 1968 3 Sheets-Sheet 2

3,557,444

MONOLITHIC BIPOLAR TRANSISTOR LOGIC CIRCUIT AND METHOD OF FORMING SAME

Carl E. Ruoff, Apalachin, N.Y., assignor to International Business Machines Corporation, Armonk, N.Y., a corporation of New York Filed Oct. 11, 1968, Ser. No. 766,690

Int. Cl. B01j *17/00;* H01l *1/16*

U.S. Cl. 29—577 6 Claims

ABSTRACT OF THE DISCLOSURE

An integrated bipolar transistor circuit of the resistor-transistor logic type is formed on a single semiconductor chip, and interconnections from transistor output electrodes and I/O (input/output) chip terminals to transistor input electrodes are provided by means of high and low resistivity regions within the chip and by a selected metallization pattern formed in a single plane above and isolated from the chip.

The high resistivity regions are diffused simultaneously with the base diffusions and the low resistivity regions are made simultaneously with the transistor isolation regions. Diffusion of the low resistivity regions is stopped by buried collector regions which are formed simultaneously with the formation of the transistor buried collector regions. The input resistance to each transistor is a constant, determined by the relative lengths of the series-connected high and low resistivity resistor regions. Shorter interconnection paths have a greater proportion of high resistivity region length than the longer paths.

CROSS-REFERENCES TO RELATED APPLICATIONS

In a copending application of R. E. Thun, Ser. No. 766,897, filed Oct. 11, 1968, there is shown a semiconductor structure and method for interconnecting on a single semiconductor chip, input electrodes of a large number of transistors with selected I/O terminals and/or with selected other transistor output electrodes by means of series-connected high and low resistivity resistor regions. The present application discloses a generally similar, but improved semiconductor structure fabricated by a more economical method with fewer process steps.

BACKGROUND OF THE INVENTION

(1) Field of the invention

Recent trends in the semiconductor art, particularly that which is concerned with data processing apparatus, have been in the direction of miniaturization of semiconductor device structures to achieve higher operating speeds, lower cost of fabrication, and greater component reliability. A large number of active transistor devices are fabricated in a single chip, i.e. a single substrate of monocrystalline material of a given conductivity type.

The present application is directed particularly to those devices utilizing bipolar transistors and further characterized by the input electrodes of the transistors being coupled to single sources by way of resistors of prescribed value. Common devices of this class are frequently referred to as RTL (Resistor-Transistor Logic) circuits.

One of the more difficult problems in fabrication of such devices has been the formation of the various electrical connections between transistors and between transistors and I/O terminals. For various technological and cost reasons, it is still presently economically feasible to produce integrated semiconductor devices with only a single layer of metallization for interconnecting devices and terminals. In addition, miniaturization requires the use, wherever possible, of resistors in the form of diffused regions within the semiconductor chip.

(2) Description of the prior art

Various solutions to the difficult interconnection problems have been suggested including the use of semiconductor "underpass" schemes. In some instances, either base or emitter diffused regions were formed in the semiconductor structure to provide electrical circuit paths crossing below the metallization paths. It has also been suggested to form a low resistivity semiconductor underpass connector, the resistivity of which is lowered to a value in the order of two ohms per square by means of a buried low resistivity region of opposite conductivity type and two surrounding isolation regions.

In the above-mentioned copending application of R. E. Thun, the concept of utilizing series-connected low resistivity underpass regions and high resistivity resistor regions of predetermined relative lengths to form the actual coupling resistors of prescribed value is described and claimed.

SUMMARY OF THE INVENTION

It is the object of the present application to provide a more versatile and lower cost semiconductor structure and method of forming same.

A preferred form of the improved structure of the present application is characterized by a semiconductor chip having I/O terminals located around the periphery of the upper surface thereof. A plurality of low resistivity regions, each bounded on the underside by a buried collector region to isolate it from the substrate material, are arranged in rows and columns within the area bounded by the I/O terminals. A plurality of transistor logic elements are arranged in two columns on either side of the columns of low resistivity regions. Intermediate each transistor logic element and the adjacent low resistivity regions are high resistivity regions, one for each base electrode, and located in one of the low resistivity region rows. Intermediate the high resistivity regions and in the same columns are additional low resistivity regions also bounded on the underside by buried collector regions, each latter low resistivity region adapted to couple a respective collector electrode alternatively to a base electrode of another transistor logic element or to a chip output terminal. Electrical contacts and metallization patterns interconnect the transistor electrodes and the high and low resistivity resistor regions in a manner so as to permit the semiconductor circuit to perform a prescribed logic function. The contacts and metallization patterns short out portions of the high and/or low resistivity regions to form conductive paths between electrodes and terminals of predetermined resistance values. No additional process steps are required; each process step being one of those that is normally required for forming active transistor devices on a single semiconductor chip.

The improved method of making interconnections between various ones of bipolar transistor electrodes and I/O terminals comprises the steps of: forming additional buried collector diffusion regions simultaneously with the formation of the transistor buried collector diffusions; forming low resisitivity regions simultaneously with formation of transistor isolation diffusion regions with each of said low resistivity regions being bounded on the underside by a respective one of said additional buried collector regions to prevent penetration into the substrate material; forming high resistivity resistor regions simultaneously with the formation of the base electrode regions; and adjusting the input resistance to each transistor input terminal to a selected value by interconnecting the transistor input terminal to its input signal source by way of predetermined lengths of low and high resistivity resistor regions.

BRIEF DESCRIPTION OF THE DRAWINGS

The foregoing and other objects, features and advantages of the invention will be apparent from the following more particular description of preferred embodiments of the invention, as illustrated in the accompanying drawings.

FIGS. 1*a*–1*n* illustrate various steps in the fabrication of one embodiment of the present invention. In this embodiment, it is assumed that coupling between each transistor base input terminal and its corresponding source of logical signals on the chip is provided solely by selected lengths of high and low resistivity regions connected directly to each other.

FIG. 1*a* illustrates a substrate 1 of P- conductivity having a resistivity in the order of twenty ohm-centimeter. The substrate 1 is preferably a monocrystalline silicon structure fabricated by conventional techniques.

Figure 1A:
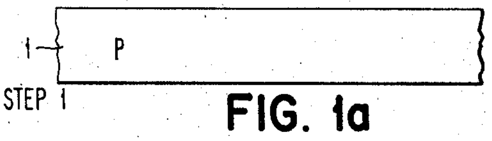
FIGS. 1*a*–1*n* are a flow diagram illustrating various steps in cross section of the fabrication process for one embodiment of the improved structure.
Figure 1B:
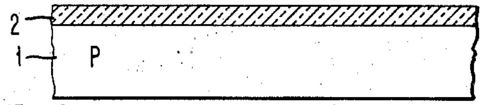
FIG. 1*b* illustrates the next step in the formation of the improved logic circuit, i.e. the formation of a silicon dioxide coating 2 over the substrate 1. The coating 2 may have a thickness in the order of eight thousand Angstrom units and may be thermally grown in a conventional manner.
Figure 1C:
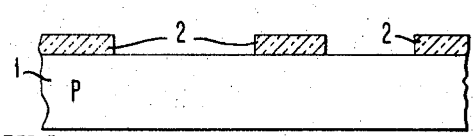
In FIG. 1*c*, conventional masking and etching techniques have been utilized to expose surfaces on the substrate 1.
Figure 1D:
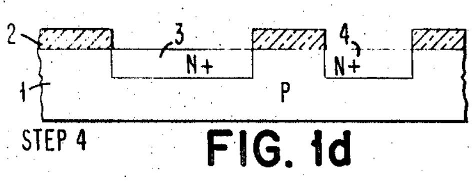
In FIG. 1*d*, a diffusion operation is carried out to diffuse into the surface of the substrate $N^+$ type regions 3 and 4 which are respectively a buried subcollector for a transistor and an isolation means for a low resistivity conductive path. The oxide layer 2 prevents the $N^+$ region from being formed in all except selected areas of the substrate.
Figure 1E:
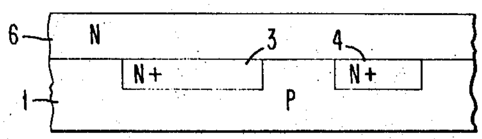

In the steps illustrated by FIG. 1*e*, the oxide layer 2 has been removed and a region 6 of N type conductivity is epitaxially grown on the surface of the substrate 1. This region 6 has a resistivity preferably in the order of two-tenths ohm-centimeter.

Figure 1F:
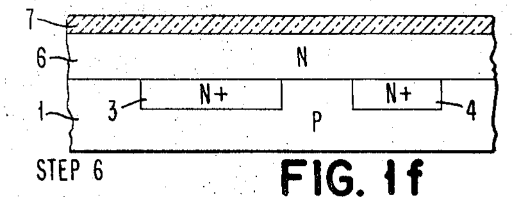

FIG. 1*f* illustrates the formation of an oxide layer 7 of approximately eight thousand Angstrom units thickness formed on the surface of the epitaxially grown region 6.

Figure 1G:
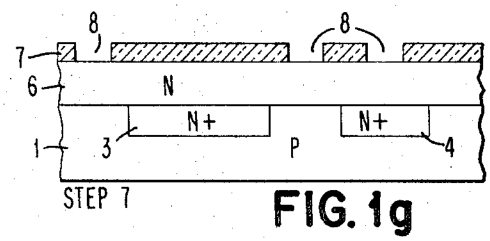

In FIG. 1*g*, openings 8 are made in the oxide layer 7 by conventional masking and etching techniques.

Figure 1H:
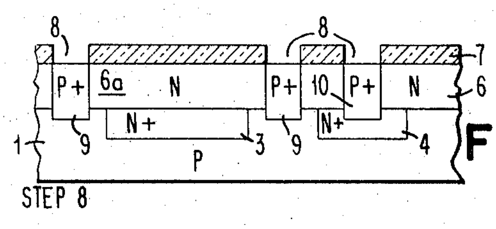

In FIG. 1*h*, a $P^+$ diffusion 9 is made in the epitaxially grown region 6 and extends into the substrate region 1. This region 9 forms a transistor isolation region and defines in the epitaxial region 6*a* the collector region of a bipolar transistor device. At the same time, an additional $P^+$ diffusion 10 is formed in the epitaxial region 6 and extends into the $N^+$ region 4. This latter region 10 is one of the low resistivity regions utilized in making input resistance connections of selected value to the input electrodes of the bipolar transistors as described above.

Figure 1I:
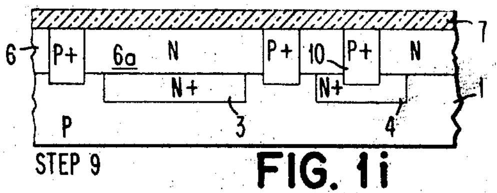

In FIG. 1*i*, the oxide layer is regrown to cover the openings 8.

Figure 1J:
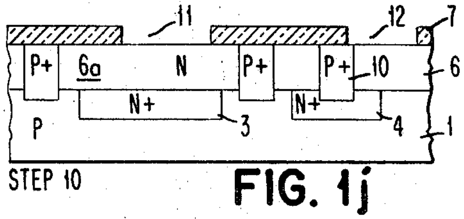

In FIG. 1*j*, masking and etching techniques are utilized to produce openings 11 and 12.

Figure 1K:
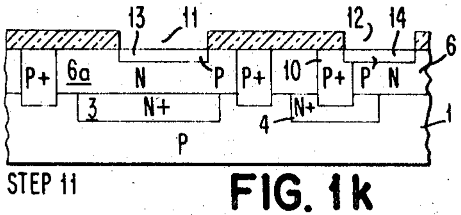

In FIG. 1*k*, P diffusions are made in the epitaxial region 6 to form a transistor base electrode 13 and simultaneously form a high resistivity resistor region 14 for a transistor base input path. It will be noted that, in this embodiment, the high resistivity resistor region 14 overlaps and makes direct electrical connection with the low resistivity resistor region 10.

Figure 1L:
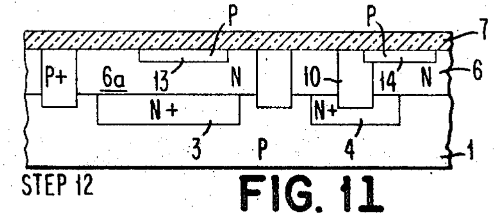

In FIG. 1*l*, the oxide layer 7 has again been regrown to cover the holes 11 and 12.

Figure 1M:
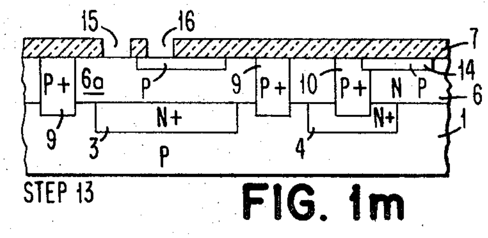

In FIG. 1*m*, masking and etching techniques have been utilized to produce holes 15 and 16 in the oxide layer 7.

Figure 1N:
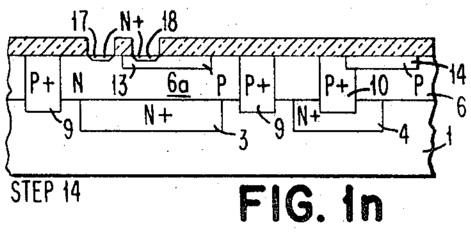

In FIG. 1*n*, $N^+$ diffusions 17 and 18 have been formed in the collector region 6*a* and in the base region 13 to form respectively the collector contact region and the emitter region of a transistor.

Thus FIG. 1*n* illustrates the result of forming a transistor on a semiconductor chip having a collector region 6*a* surrounded by an isolation region 9 and bounded below by a buried subcollector region 3, and further including a base region 13, an emitter region 18 and a collector contact region 17. The various FIGS. 1*a*–1*n* further illustrate how the high resistivity region 14 is formed simultaneously with the formation of the base region 13, how the low resistivity region 10 is formed simultaneously with the transistor isolation region 9 and how it is bounded on the lower side thereof by the buried subcollector region 4. FIG. 1*m* also illustrates one manner in which the high and low resistivity regions can be electrically connected to each other.

It will be appreciated that, subsequent to the step illustrated in FIG. 1*n*, the oxide layer 7 will be regrown to fill the holes 15 and 16 and that subsequent thereto, electrical connections between the transistor electrodes and the high and low resistivity resistor regions will be made with other transistors and/or I/O terminals on the semiconductor chip by conventional metallization patterns and contacts. In the embodiment of FIGS. 1*a*–1*n*, the total length of the combined high and low resistivity resistor regions will be determined by the topography of the logic function provided by the semiconductor chip. In some cases, the total length will be relatively short and in others relatively long. The relative lengths of the high resistivity resistor region and the low resistivity resistor region will be determined in each case by the length of the connection path. Where the total length of the path is relatively short, a greater proportion of the total length will be made by the high resistivity region; and, as the length of the path increases, the proportion of the total length occupied by the low resistivity resistor region will increase.

Figure 2:
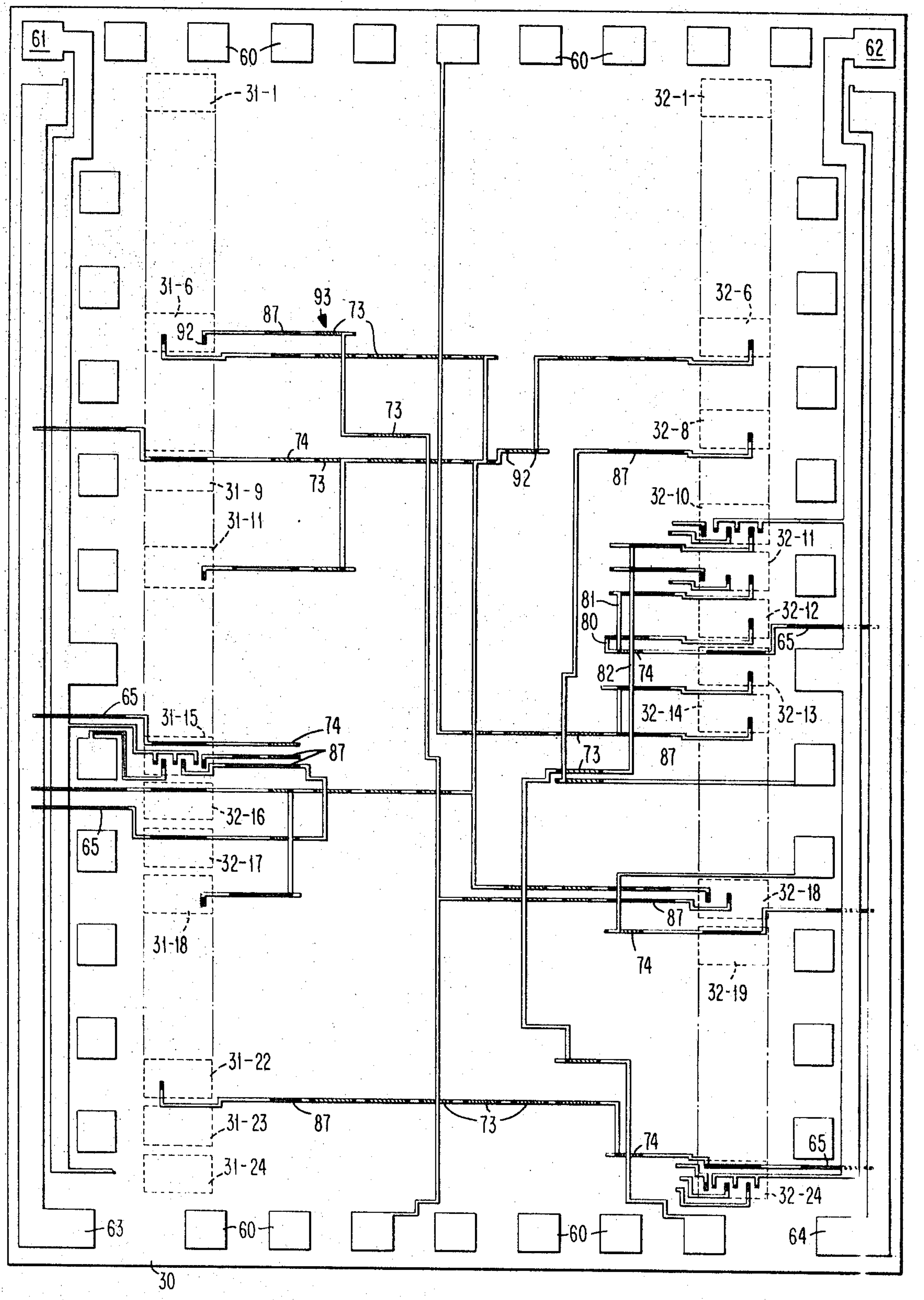
FIG. 2 is a fragmentary plan view of a more versatile and sophisticated integrated circuit arrangement utilizing applicant's improved semiconductor structure and method.

The more versatile integrated circuit arrangement of FIGS. 2–9 will now be described in detail. The fragmentary plan view of FIG. 2 shows a single semiconductor chip 30 populated with two columns of transistor logic devices 31–1 to 31–24 and 32–1 to 32–24, only some of which are shown.

Figure 8:
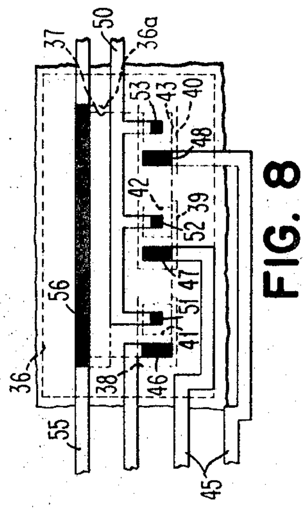
FIG. 8 is an enlarged plan view of one of the three-transistor logic devices incorporated in the structure of FIG. 2.
Figure 9:
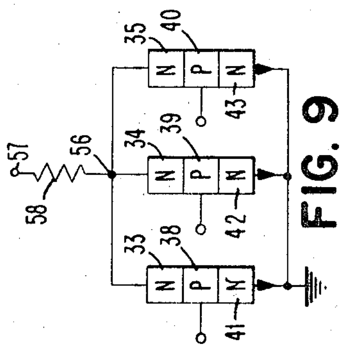
FIG. 9 is a schematic diagram of the three-transistor logic device on FIG. 8.

As seen in FIGS. 8 and 9, each transistor logic device comprises three NPN transistors such as 33, 34 and 35 having a common collector region 36 with a lower resistivity diffusion portion 36*a* and a buried subcollector region 37, individual base regions 38, 39, 40 and individual emitter regions 41, 42 and 43. Electrical connections to the base regions 38–40 are made via metallization pattern sections 45 and contacts 46, 47, 48. Electrical connections to the emitter regions 41–43 are made via a metallization pattern section 50 and contacts 51, 52 and 53; connections to the collector region 36 via metallization pattern section 55 and contact 56.

A positive signal applied to the base region of transistor 33, 34 or 35 will operate the respective transistor at its high conductivity level; and ground potential applied to a base region will operate the respective transistor substantially at cutoff.

If all transistors 33–35 are at cutoff, a positive potential appears at the collector output contact 56 via a power supply terminal 57 and a resistor 58; any one transistor 33, 34 or 35, when conductive, applies ground potential to the contact 56. Thus the transistors 33–35 perform a logical OR function if a positive input signal is assumed to be a logical "1" condition; or a logical AND function, if ground potential is a logical "1" condition.

Returning again to FIG. 2, the chip 30 further includes I/O (input/output) terminals 60 positioned along the periphery thereof. Terminals 61 and 62 couple ground potential to the emitter regions of the transistors, and terminals 63 and 64 couple a positive supply potential to the collector regions via resistors 65, only a few of which are shown.

Figure 3:
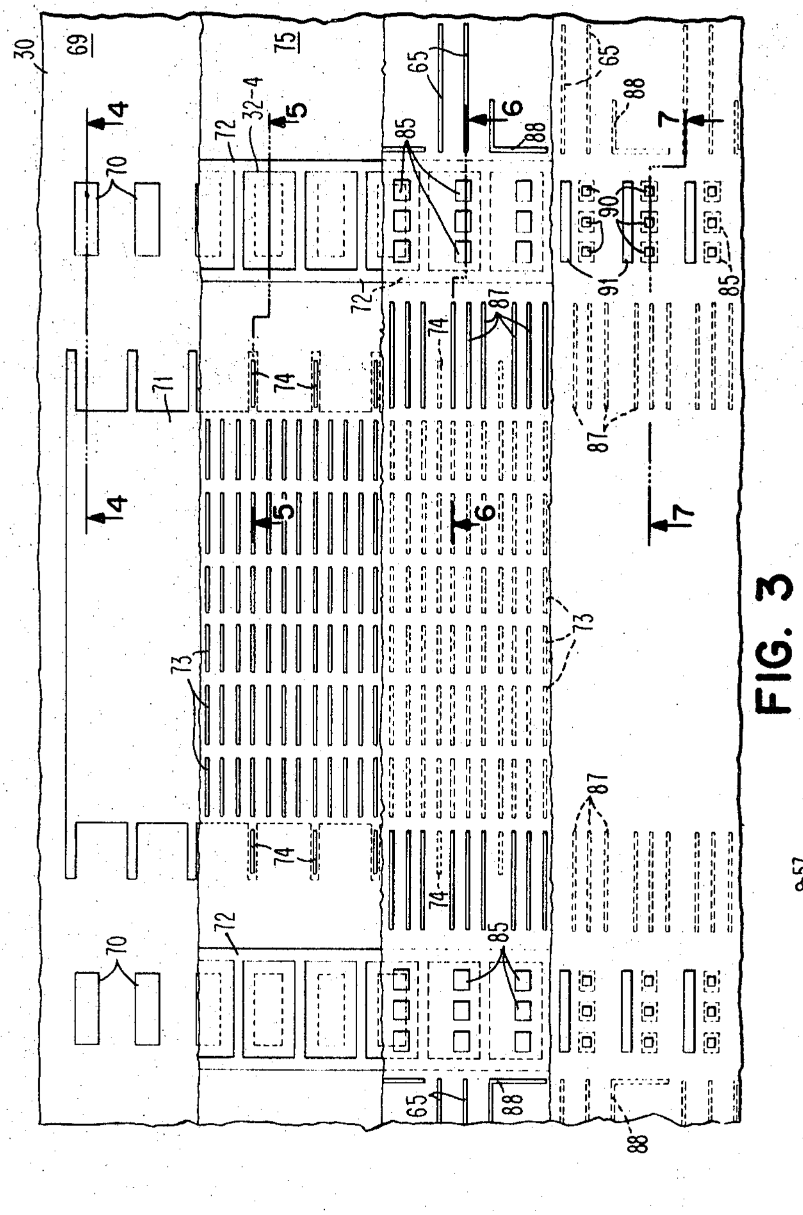
FIG. 3 is a fragmentary cut-away plan view illustrating certain of the steps in forming the structure of FIG. 2.

FIGS. 3–7 illustrate certain of the process steps utilized in forming the integrated circuit of FIG. 2, which process steps are generally similar to those illustrated in FIGS. 1*a*–1*n*. In FIG. 3, the fragmentary horizontal sections from top to bottom illustrate succeeding steps in the process of fabricating the semiconductor chip 30.

Figure 4:
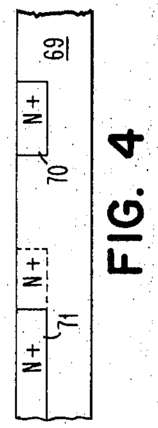
FIGS. 4–7 are fragmentary cross-section views respectively along lines 4—4 to 7—7 of FIG. 3 illustrating certain of the steps of the fabrication process for the structure of FIG. 2.

Thus, in FIGS. 3 and 4, buried subcollector regions 70 for each of the transistor logic devices 31–1 to 31–24 and 32–1 to 32–24 (FIG. 2) are shown together with a buried subcollector region 71 which will underlie later-formed low resistivity resistor regions. The regions 70 and 71 are formed simultaneously by selectively masking portions of the substrate 69 of chip 30 and forming in the surface of the unmasked portions $N^+$ type diffusions, for example, by process steps similar to those described with respect to FIGS. 1*a*–1*d*.

Figure 5:
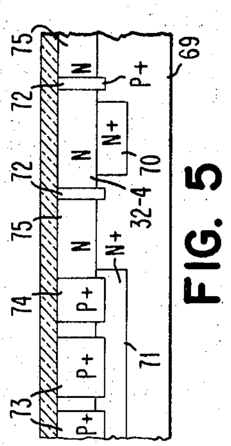

In FIGS. 3 and 5, transistor isolation regions 72 are shown together with low resistivity resistor regions 73 and 74. The regions 73 are utilized primarily for input resistor connections to the base regions of the various transistor; but, in addition, are used to complete collector output signal connections where required. The regions 74 are used exclusively for collector output signal connections, one region 74 being provided for a respective one of the logic devices 31–1 to 31–24 and 32–1 to 32–24 (FIG. 2). The regions 73 and 74 each overlie a portion of the buried subcollector region 71. The regions 73 and 74 are arranged in rows and are further arranged in columns, each column defining an area for a group of parallel vertical metallization pattern line positions. For example, note the three parallel vertical metallization pattern line sections 80, 81, 82 (FIG. 2) overlying one of the regions 74. The regions 72, 73 and 74 are formed simultaneously by growing an N type region 75 on the surface of the substrate 69 and thereafter selectively masking portions of the region 75 and forming in the surface of the unmasked portions of the region 75, $P^+$ type diffusions 72, which extend into the substrate 69 and $P^+$ diffusions 73 and 74 which extend into the region 71, for example, by process steps similar to those described with respect to FIGS. 1*e*–1*h*.

Figure 6:
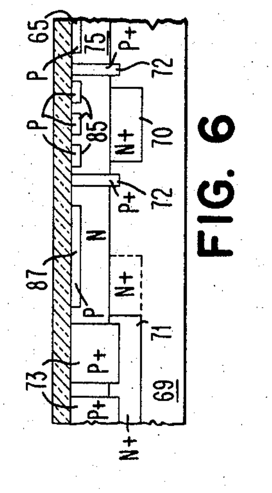

In FIGS. 3 and 6, transistor base regions 85 are shown together with simultaneously formed high resistivity resistor regions 65, 87 and 88. Regions 65 are used to couple the transistor collector regions to the positive supply terminals 63 and 64 (FIG. 2). Regions 87, one for each base region, are used to couple input signals to the base regions via paths including metallization pattern sections and the low resistivity regions 73. Regions 88 are used to couple input signals to the base region of an immediately adjacent transistor, for example, as shown with respect to the logic device 31–15 of FIG. 2. The regions 85, 65, 87 and 88 are formed simultaneously by selectively masking portions of the region 75 and forming in the surface of the unmasked portions P type diffusions, for example, by process steps similar to those illustrated by FIGS. 1*i*–1*k*.

Figure 7:
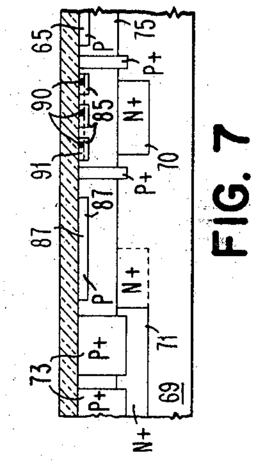

In FIGS. 3 and 7, transistor emitter regions 90 are shown together with collector contact regions 91. The regions 90 and 91 are formed simultaneously by selectively masking portions of the base and collector regions and forming in the surface of the unmasked portions $N^+$ type diffusions, for example, by process steps similar to those illustrated by FIGS. 1*l*–1*n*.

Thereafter, the selected contacts 92 (shown in solid black squares and rectangles in FIG. 2) and the metallization pattern 93 (such as that partially shown in FIG. 2) are formed in a conventional manner to provide the desired logical function by electrically interconnecting selected base, emitter and collector regions, power supply terminals and I/O terminals via the high and low resistivity regions.

It will be appreciated that, in producing chips such as 30 which provide different logical functions, only the contact and metallization patterns change. The various active and passive regions of the chips do not vary. Thus the same masks used to form the active and passive regions do not change, merely the masks used to form the contacts and metallization pattern, thus affording substantial economies.

Certain of the interconnections illustrate the flexibility of the arrangement of FIGS. 2–9. By way of example, it will be assumed that the input resistance to each base region is substantially equal to one thousand (1000) ohms, that each high resistivity region 87 has a total resistance of one thousand (1000) ohms and that each low resistivity region 73 and 74 has a total resistance equal to fifty (50) ohms.

The interconnection from the collector region of device 32–24 (FIG. 2) one base region of the device 31–22 includes one low resistivity region 74 and six low resistivity regions 73; hence, a significant portion of the high resistivity region 87 in the interconnection is bypassed to provide a total series interconnecton resistance of one thousand ohms.

On the other hand, the interconnection between the collector region of the device 31–17 and one of the base regions of the device 31–15 includes only one low resistivity region 74 and one high resistivity region 87; hence, only a very small portion of the region 87 is bypassed to provide a total series interconnection resistance of one thousand ohms.

The other region 87 shown connected to a base region of the device 31–15 illustrates short-circuiting of a portion of the region 87 rather than bypassing a portion thereof.

Certain of the interconnections between respective I/O terminals and devices 32–8, 31–6 and 32–19, 32–10 and 32–11, and 32–13 and 32–14 illustrate the ease and flexibility in making large numbers of complex interconnections on the improved integrated circuit chip with only one layer of metallzation pattern and maximum utilization of the areas required for base input resistances.

A typical complex interconnection is made between the collector region of the device 31–16 and base regions of devices 31–18, 31–6 and 32–18; another interconnection is made between the collector region of the device 31–9 and base regions of the devices 31–11 and 32–6.

While the invention has been particularly shown and described with reference to preferred embodiments thereof, it will be understood by those skilled in the art that the foregoing and other changes in form and details may be made therein without departing from the spirit and scope of the invention.

I claim:

1. A method for fabricating on a single substrate of monocrystalline semiconductor material of one conductivity type a plurality of interconnected bipolar transistor circuits of the type wherein base regions of the transistors are adapted for connection to respective input signal sources by way of respective input resistances each of selected value and characterized by at least one high resistivity resistor region in series with at least one low resistivity region of predetermined relative lengths, comprising the steps of:

selectively masking portions of the substrate and diffusing into the unmasked portions a sufficient quantity of impurities to convert portions of the substrate into low resistivity regions of opposite conductivity type to form simultaneously buried collector regions which underlie transistor collector positions and selected low resistivity resistor region positions, epitaxially growing a layer of said opposite conductivity type to bury the low resistivity buried collector regions, selectively masking portions of the surface of the epitaxially grown layer and diffusing into the unmasked portions a sufficient quantity of impurities to convert the unmasked portions into regions of said one conductivity type having a lower resistivity than said epitaxially grown layer to form isolation regions which define therewithin bipolar transistor collector regions and to form simultaneously low resistivity resistor regions in said selected positions, selectively masking portions of the surface of the epitaxially grown layer and diffusing into the unmasked portions a sufficient quantity of impurities to convert portions of the epitaxially grown layer into regions of said one conductivity type to form base regions of the bipolar transistors and to form simultaneously high resistivity resistor regions, selectively masking portions of the surface of the epitaxially grown layer and diffusing into certain unmasked portions defining the bipolar transistor collector and base regions a sufficient quantity of impurities to convert said portions of the base regions into emitter regions of said opposite conductivity type having a lower resistivity than the base region and to form simultaneously collector contact regions of lower resistivity than the remaining portions of the collector regions, forming spaced metallic contacts electrically connected to selected portions of the base, emitter and collector contact regions and to selected high and low resistivity resistor regions, and forming a plurality of metallization patterns in a single layer above and isolated from the epitaxially grown layer to interconnect the electrical contacts for providing a desired logical function.

2. The method of claim 1 wherein at least certain of the high and low resistivity resistor regions are joined by diffusing a portion of one region into the other.

3. The method of claim 1 wherein the low resistivity resistor regions are formed in one direction on the substrate and essentially provide signal communication in that direction and wherein the metallization patterns are formed essentially for communication in a direction perpendicular to said one direction.

4. The method of claim 3 wherein the high resistivity resistor regions are formed to have one predetermined value and wherein the contacts and patterns are formed so as to short-circuit portions of the high resistivity resistor regions to provide base region input resistances of selected value irrespective of the lengths of the paths between the base regions and their respective input signal sources and irrespective of the values of the low resistivity resistor regions in the paths.

5. The method of claim 4 wherein the high resistivity resistor regions are formed so that the resistance value of each is not less than the selected value of the input resistance to the base regions.

6. In a method for monolithically fabricating a plurality of interconnected bipolar transistor circuits on a single substrate of monocrystalline semiconductor material of one conductivity type, wherein each transistor is formed with base, emitter and collector regions, one of which defines an input electrode and another of which defines an output electrode, wherein each transistor is formed with a buried collector diffusion region and is separated from other transistors by respective isolation diffusion regions and wherein each transistor is adapted to have an input resistance means of a selected value, the method of making interconnections between various ones of the input and output electrode regions and between input/output terminals on the substrate and the input and output electrode regions comprising the steps of:

forming additional buried collector diffusion regions, simultaneously with the formation of the transistor buried collector diffusion regions, within the substrate underneath a plurality of low resistivity diffused resistor region positions;

forming low resistivity diffused resistor regions in said positions, simultaneously with the formation of the isolation diffusion regions, so that said low resistivity diffused resistor regions are bounded on the under side by said additional buried collector diffusion regions to prevent penetration of the low resistivity diffused resistor regions into the substrate material, forming high resistivity diffused resistor regions simultaneously with the formation of the base electrode regions; and forming the input resistance means to each transistor to its selected value by interconnecting the input electrode alternatively to a predetermined output electrode of another transistor or to an input/output terminal by means of various ones of the high and low resistivity diffused resistor regions and various contact and metallization patterns.

References Cited

UNITED STATES PATENTS

| | | | |
|---|---|---|---|
| 3,253,197 | 5/1966 | Haas. | |
| 3,380,153 | 4/1968 | Husher et al. | 29—577 |
| 3,414,782 | 12/1968 | Lin et al. | 317—235 |
| 3,423,653 | 1/1969 | Chang | 317—235 |

JOHN F. CAMPBELL, Primary Examiner

W. TUPMAN, Assistant Examiner

U.S. Cl. X.R.

148—175; 317—235